(12) United States Patent
Hedges

(10) Patent No.: US 6,985,802 B2
(45) Date of Patent: Jan. 10, 2006

(54) METHOD OF DIAGNOSING AN ELECTRONIC CONTROL UNIT

(75) Inventor: Mary T. Hedges, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 57 days.

(21) Appl. No.: 10/420,377

(22) Filed: Apr. 22, 2003

(65) Prior Publication Data

US 2004/0215378 A1 Oct. 28, 2004

(51) Int. Cl.
G01M 17/00 (2006.01)
G06F 19/00 (2006.01)

(52) U.S. Cl. .............................. 701/29; 701/35; 714/30

(58) Field of Classification Search .................. 701/29, 701/34, 33, 35, 102, 115, 31, 99, 114; 73/117.3, 73/117.2; 714/5, 10, 30, 45
See application file for complete search history.

(56) References Cited

U.S. PATENT DOCUMENTS

| 4,843,557 | A | * | 6/1989 | Ina et al. .................... 701/114 |
|---|---|---|---|---|
| 5,072,391 | A | * | 12/1991 | Abe ............................. 701/35 |
| 5,594,646 | A | * | 1/1997 | Itoh et al. ...................... 701/35 |
| 5,794,165 | A | * | 8/1998 | Minowa et al. ................. 701/1 |
| 6,271,637 | B1 | | 8/2001 | Kushion |
| 6,381,545 | B1 | | 4/2002 | Goubeaux et al. |
| 6,497,092 | B1 | | 12/2002 | Theis |
| 6,553,290 | B1 | * | 4/2003 | Pillar .......................... 701/33 |
| 6,625,688 | B1 | | 9/2003 | Fruehling et al. |
| 6,736,102 | B2 | * | 5/2004 | Konrad et al. .............. 123/295 |

* cited by examiner

*Primary Examiner*—Thomas G. Black
*Assistant Examiner*—Dalena Tran
(74) *Attorney, Agent, or Firm*—Stefan V. Chmielewski

(57) ABSTRACT

An electronic control unit and a method of diagnosing an electronic control unit on a vehicle are provided. The method includes the steps of storing in memory information on variables to collect, selecting a trigger, monitoring for a predetermined event, activating the trigger based on the detection of the event, collecting the variables upon activation of the trigger, and storing the collected variables in memory. The collected variable may be read via a pre-existing production serial link to diagnose the electronic control unit.

8 Claims, 6 Drawing Sheets

METHOD OF DIAGNOSING AN ELECTRONIC CONTROL UNIT

TECHNICAL FIELD

The present invention generally relates to automotive diagnostics and, more particularly, to data collection for diagnostics of an electronic control unit on a vehicle in its production configuration.

BACKGROUND OF THE INVENTION

Automotive vehicles are commonly equipped with a plurality of electronic control units for controlling various functions onboard the vehicle. A typical vehicle includes an engine control unit, a drivetrain control unit, a body control unit, and various other electronic control units, all of which typically employ a microcontroller having a microprocessor and memory. As part of the vehicle development, the presence of electronic control units introduce the need to diagnose the microcontrollers. In the past, if an electronic control unit experienced a problem, the electronic control unit was diagnosed by installing an instrumentation connector to the unit, recompiling the software stored in memory in the unit to enable show cycles, connecting a logic analyzer to the unit, and then beginning diagnostic investigation of the problem.

The typical electronic control unit diagnostic techniques have enabled the development engineer to reconfigure a given electronic control unit. However, such diagnostic approaches may also eliminate evidence of the problem and, hence, make it more difficult to determine the cause of a problem. Some more sophisticated high-end microcontrollers are expected to include debug support integrated in the electronic control unit. The debug support may include a debug interrupt service routine which may contain logic to control trigger points that are set up to fetch addresses or data while executing in a specified address range.

It is therefore desirable to provide for the ability to perform a diagnostic operation on an electronic control unit which allows for analysis of an event, particularly one that is a problem. It is further desirable to provide for diagnostics for use on an electronic control unit on a vehicle, to perform vehicle level diagnostics.

SUMMARY OF THE INVENTION

In accordance with the teachings of the present invention, an electronic control unit and a method of diagnosing an electronic control unit are provided. According to one aspect of the present invention, the method of diagnosing the electronic control unit includes the steps of storing in memory information on variables to collect, selecting a trigger, and monitoring for a predetermined event. The method further includes the steps of activating the trigger based on the detection of the event, collecting the variables upon activation of the trigger, and storing the collected variables in memory.

According to another aspect of the present invention, the electronic control unit comprises a processor, memory for storing variables, an interrupt service routine for performing a software interrupt, and a debug handler for performing a debug operation. The debug handler detects an event, activates a trigger based on the detection of the event to initiate the interrupt service routine, collects predetermined variables, and stores the collected variables in memory.

Accordingly, the electronic control unit and method of the present invention advantageously collect predetermined variables, such as engine parameters or variable pointers when a specified event occurs. The collection of the predetermined variables enables the diagnostic evaluation of the electronic control unit in an attempt to solve any problems which caused the event, and further enables debugging of the electronic control unit in a production environment. The present invention also allows the collected information to be passed from the electronic control unit to the development engineer's tool using existing electronic control unit resources such as the production serial link.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
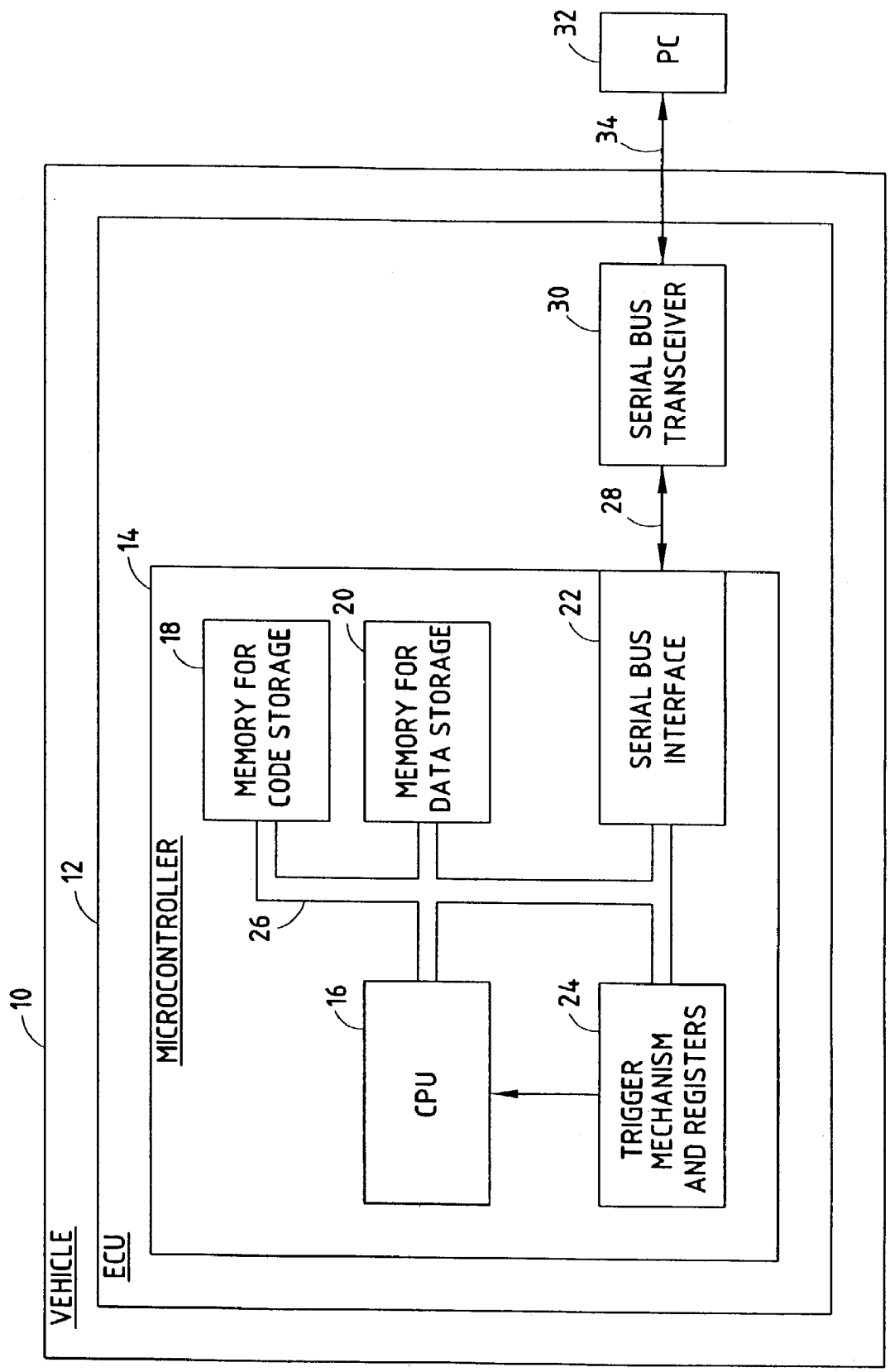
FIG. 1 is a block diagram illustrating a vehicle containing an electronic control unit coupled to a personal computer diagnostic tool.

Referring to FIG. 1, a vehicle is generally illustrated by block 10. The vehicle 10 includes a microprocessor-based electronic control unit (ECU) 12. While a single electronic control unit 12 is shown and described herein, it should be appreciated that the vehicle 10 may include a production vehicle having any number of one or more electronic control units, any one or more of which may be diagnosed according to the teachings of the present invention. The electronic control unit 12 may include any of an engine control unit, a drivetrain control unit, a body control unit, and various other microprocessor-based electronic control units that are employed onboard a vehicle.

The electronic control unit 12 includes a microcontroller 14 having a microprocessor shown as a central processing unit (CPU) 16. The microcontroller 14 also has memory 18 for storing codes, and memory 20 for storing data. Additionally, microcontroller 14 includes a serial data bus interface 22 and trigger mechanism and registers 24. The central processing unit 16, memory 18, memory 20, serial bus interface 22, and trigger mechanism and registers 24 are shown coupled in data communication with each other via a microcontroller interface bus 26.

The central processing unit 16 processes various routines including a routine for configuring the electronic control unit 12 to store predetermined variables during a trigger event, a debug interrupt service routine (ISR) to collect and store the variables, and a routine to upload the stored data upon receiving a read message. The routines processed by the central processing unit 16 may be stored in non-volatile memory 18, while the data variables may be stored in volatile or non-volatile memory 20. The trigger mechanism and registers 24 may include a hardware configuration to select a trigger based on a predetermined event. According to one embodiment, the trigger mechanism and registers 24 may be configured to include a single trigger event. One example of a trigger event may include software writing to a particular variable address or the software executing a particular piece of code. It should be appreciated that multiple trigger events may be provided in hardware and/or software, and the multiple triggers may be configured to provide complex triggers such as sequential triggers which require a sequence of events to occur. Upon the trigger conditions occurring, the debug interrupt service routine initiates data collection to store predetermined variables in a memory buffer. The stored variables are retrievable to enable diagnosis of the electronic control unit 12.

The electronic control unit 12 also includes a serial data bus transceiver 30. Serial bus transceiver 30 communicates with a serial bus interface 22 via serial data bus 28. The serial bus transceiver 30, in turn, communicates with an off board personal computer (PC) 32. The personal computer 32 may include a diagnostic tool, such as a fixed or mobile computer and/or handheld onboard or offboard diagnostics tool having processing, memory, and user interface capability. The serial data bus transceiver 30 communicates with the personal computer 32 via a serial data link 34 which may include a wire or wireless serial data communication link. The diagnostic tool personal computer 32 has an interface that allows a user, such as a diagnostic technician or development engineer, to configure one or more triggers and predetermined variables to perform a diagnostic function. The user may also acquire stored variables from the electronic control unit 12 by requesting information in a read message via the personal computer 32.

Figure 2:
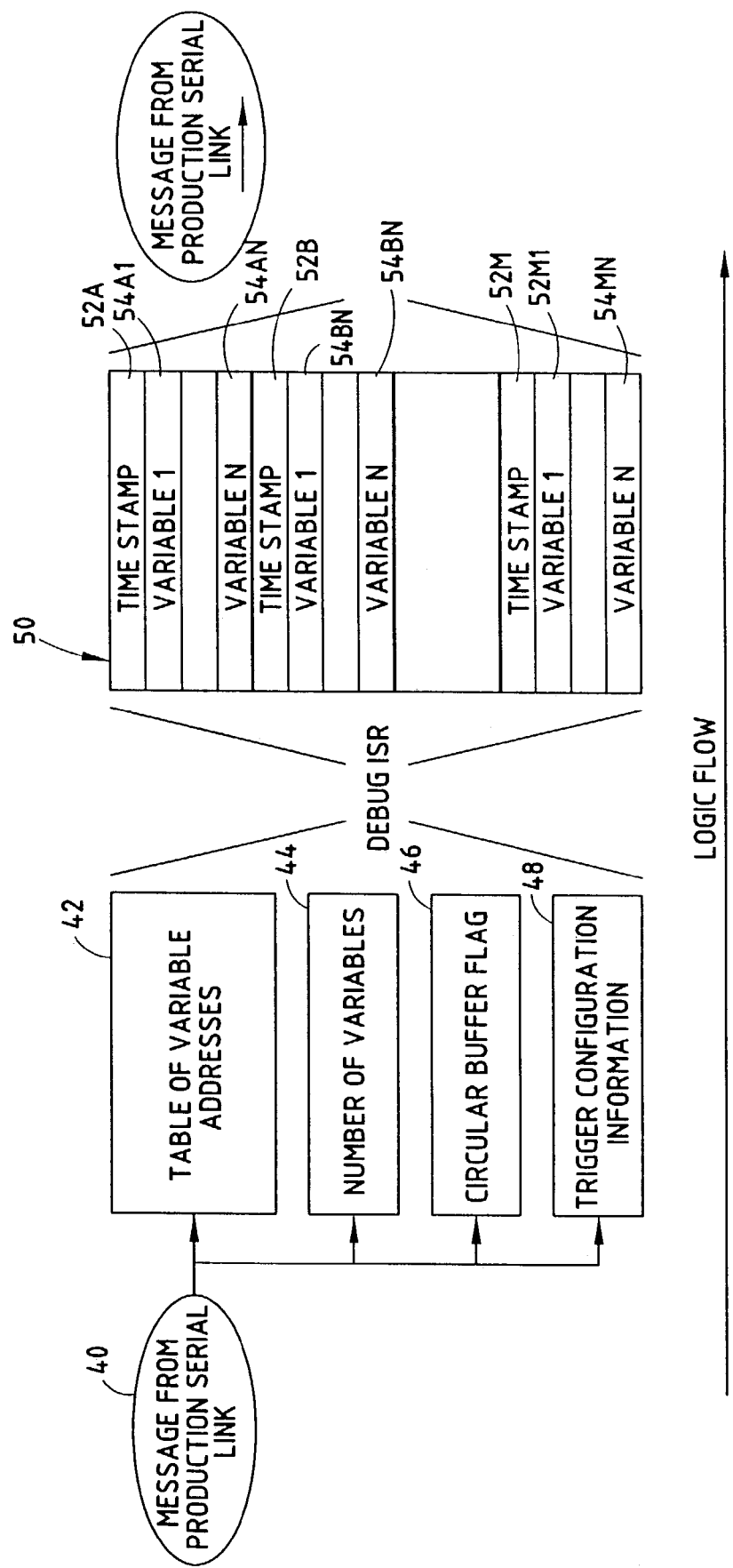
FIG. 2 is a block diagram illustrating the configuration setup and variables stored in buffer memory.

Referring to FIG. 2, a sequence of events for configuring the diagnostic variables, storing the collected variables following a trigger event, and uploading stored variables from the buffer memory of the electronic control unit 12 is illustrated therein. A configuration message 40 is received via the production serial link to program in memory selected variables to be collected and one or more trigger configurations. Included in the configuration message 40 is information to set up a table of variable addresses 42, the number of variables to be collected 44, a circular buffer flag 46, and the trigger configuration information 48. The circular buffer flag provides either a first binary state, e.g., 1, to indicate a circular buffer configuration, or a second binary state, e.g., 0, indicative of a straight buffer configuration. The trigger configuration information 48 may include one or more trigger conditions for triggering a debug interrupt service routine based on a predetermined one or more events.

Once the variables and trigger configuration information is stored in memory, the debug interrupt service routine is operated upon experiencing a trigger event to collect and store the selected variables in memory, shown as memory buffer 50. The memory buffer 50 as shown includes time stamps 52A–52M associated with the time of collection of a set of stored variables. The stored variables may include variables 1–N shown in memory locations 54A1–54MN. Any number of selected variables may be stored in memory buffer 50, depending upon the variable configuration set by a user, such as a diagnostic technician or development engineer. The variables collected and stored in memory buffer 50 following a trigger event may then be uploaded from the memory buffer 50 into the personal computer 32 at the request of a user, by receiving a read message via the production serial link.

Figure 3A:
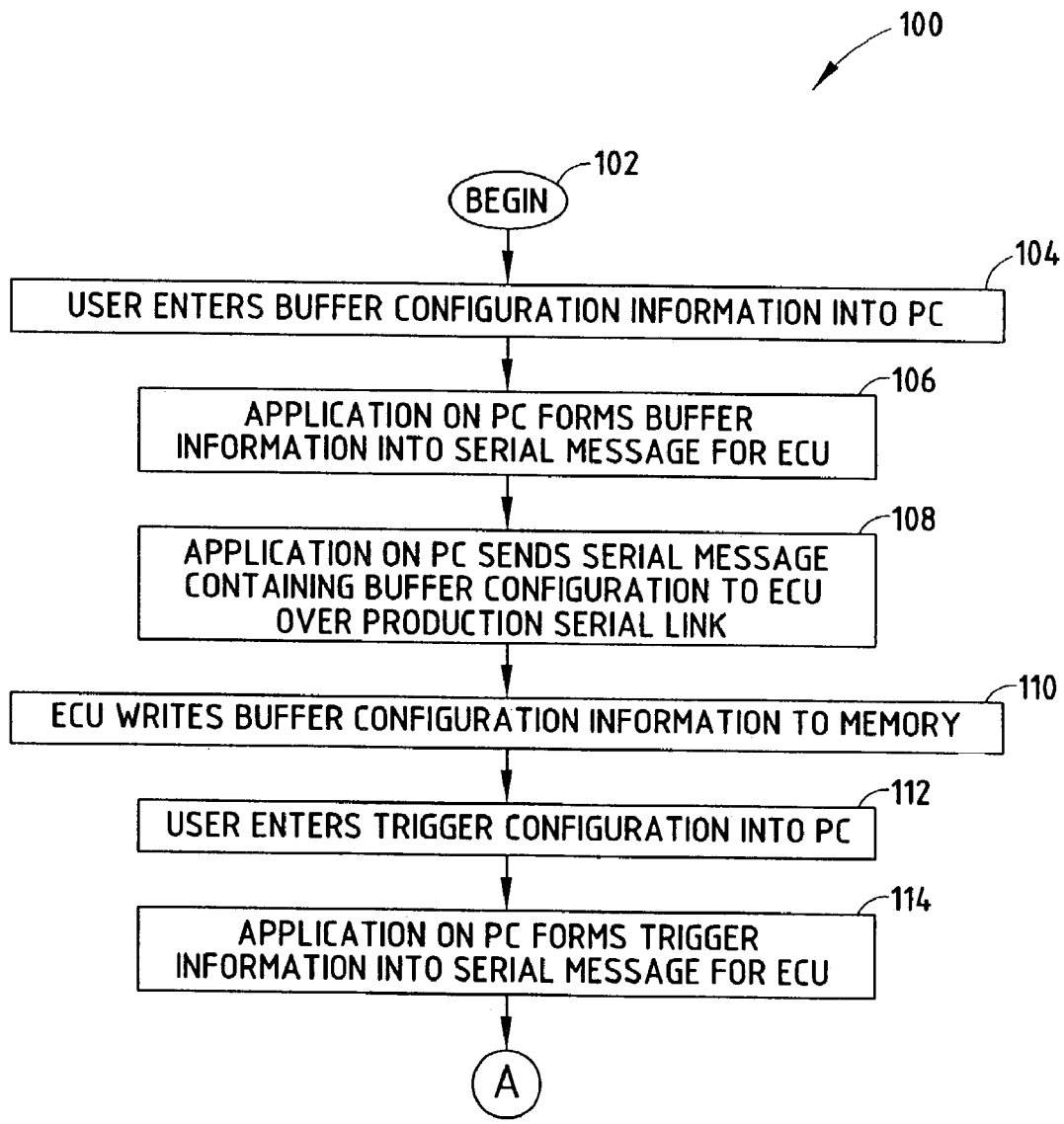
FIGS. 3A and 3B are flow diagrams illustrating a routine for setting the buffer and trigger configurations.
Figure 3B:
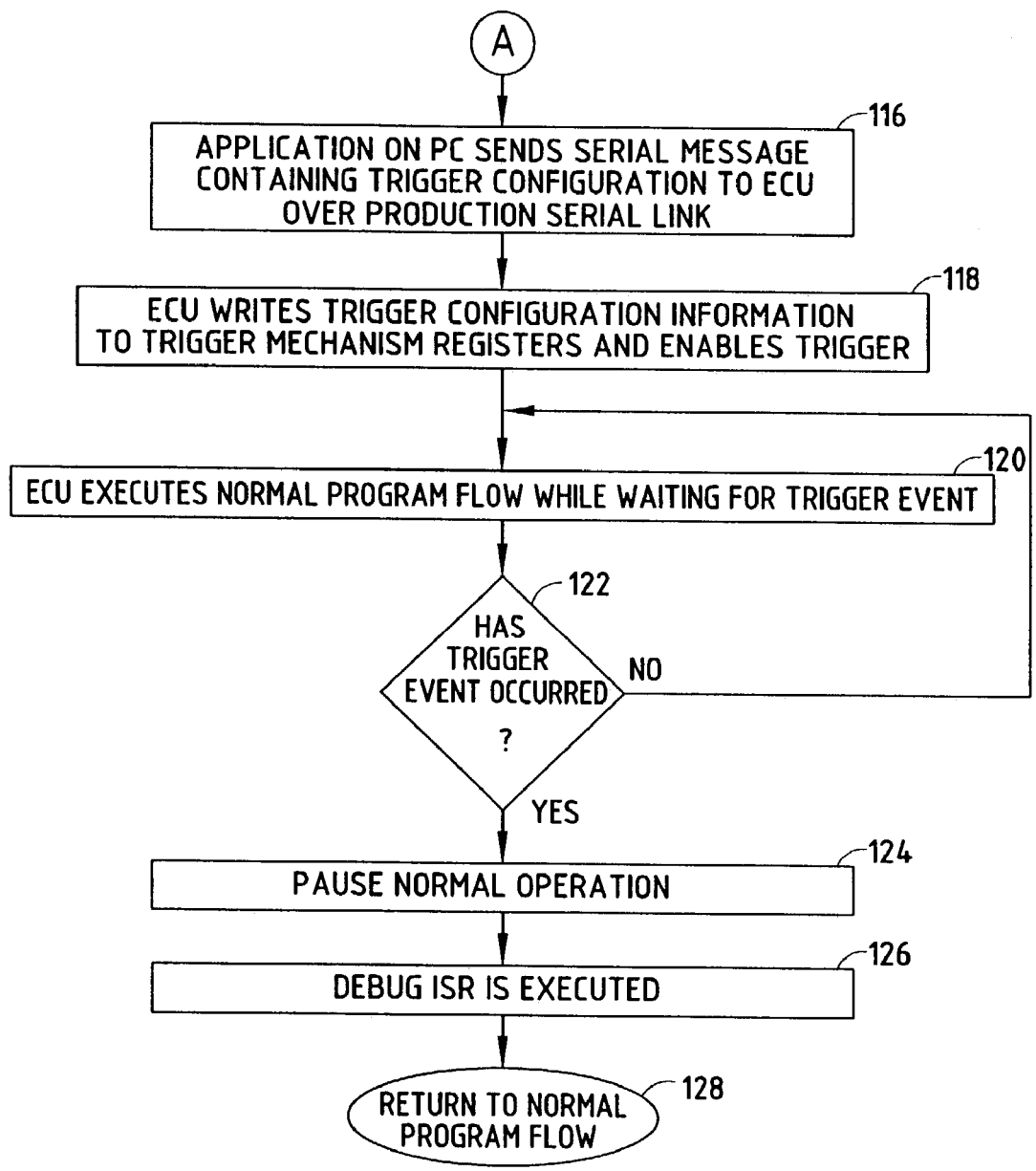

Referring to FIGS. 3A and 3B, a routine 100 is illustrated for configuring the memory buffer and trigger configurations and monitoring for a predetermined trigger event. Routine 100 begins at step 102 and, in step 104, the user enters the memory buffer configuration information into the personal computer. The memory buffer information may include the table of variable addresses to be collected, the number of variables, and the buffer configuration (circular or straight). In step 106, an application on the personal computer forms the buffer information into a serial message for the electronic control unit. Next, in step 108, the application on the personal computer sends the serial message containing the memory buffer configuration to the electronic control unit over the production serial link. The electronic control unit writes the memory buffer configuration information to memory in step 110. In step 112, the user enters the trigger configuration into the personal computer. Proceeding to step 114, the application on the personal computer forms the trigger information into the serial message for the electronic control unit. The application on the personal computer sends the serial message containing the trigger configuration to the electronic control unit over the production serial link in step 116. The electronic control unit then writes the trigger configuration information to the trigger mechanism registers and enables the trigger in step 118. The electronic control unit executes the normal program flow while waiting for the trigger event to occur in step 120.

Following step 120, routine 100 proceeds to decision step 122 to determine if the trigger event has occurred. If the trigger event has not occurred, routine 100 returns to step 120. If the trigger event has occurred, normal operation of routine 100 is halted in step 124 and the debug interrupt service routine (ISR) is executed in step 126. The debug interrupt service routine collects and stores the predetermined variables in the memory buffer. Following execution of the debug interrupt service routine in step 126, the routine 100 returns to the normal program flow in step 128.

Figure 4:
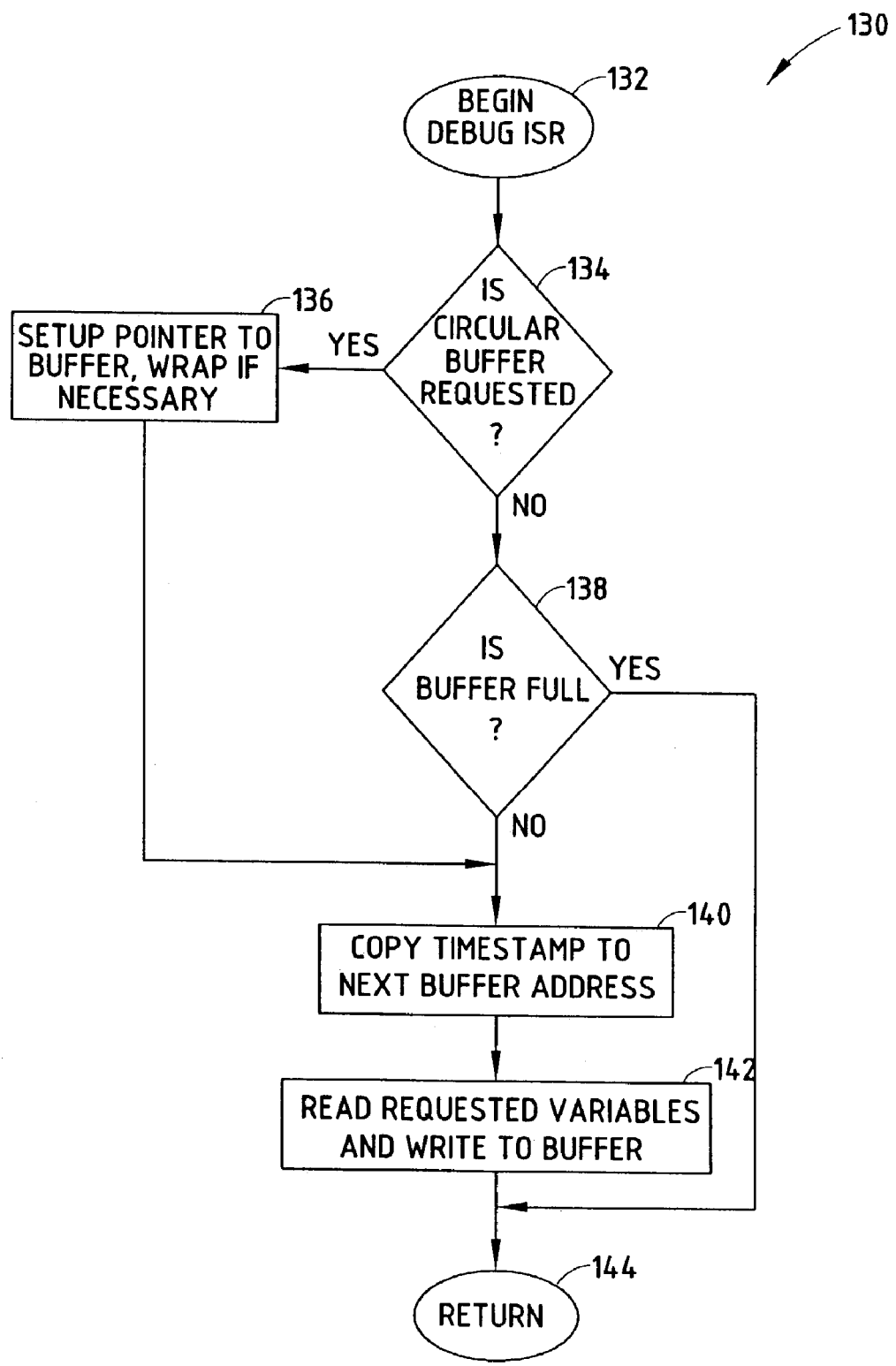
FIG. 4 is a debug interrupt service routine.

Referring to FIG. 4, the debug interrupt service routine 130 is illustrated for collecting and storing the predetermined variables in the buffer memory. The debug interrupt service routine 130 begins at step 132 and proceeds to decision step 134 to determine if the circular buffer has been requested. If the circular buffer has been requested, the memory buffer is set up with a pointer with a wrap function, if necessary, in step 136. If the circular buffer has not been requested, indicative of the selection of a straight buffer, debug interrupt service routine 130 proceeds to decision step 138 to see if the memory buffer is full. If the memory buffer is not full, debug interrupt service routine 130 proceeds to step 140 to copy the time stamp to the next memory buffer address, and then to step 142 to read the requested variables and to write the requested variables to the memory buffer. If the memory buffer is full, or once the requested variables have been written to the memory buffer, the debug interrupt service routine 130 returns in step 144. Accordingly, the requested variables may be written to memory by employing either a circular or a linear buffer, as designated by a user.

Figure 5:
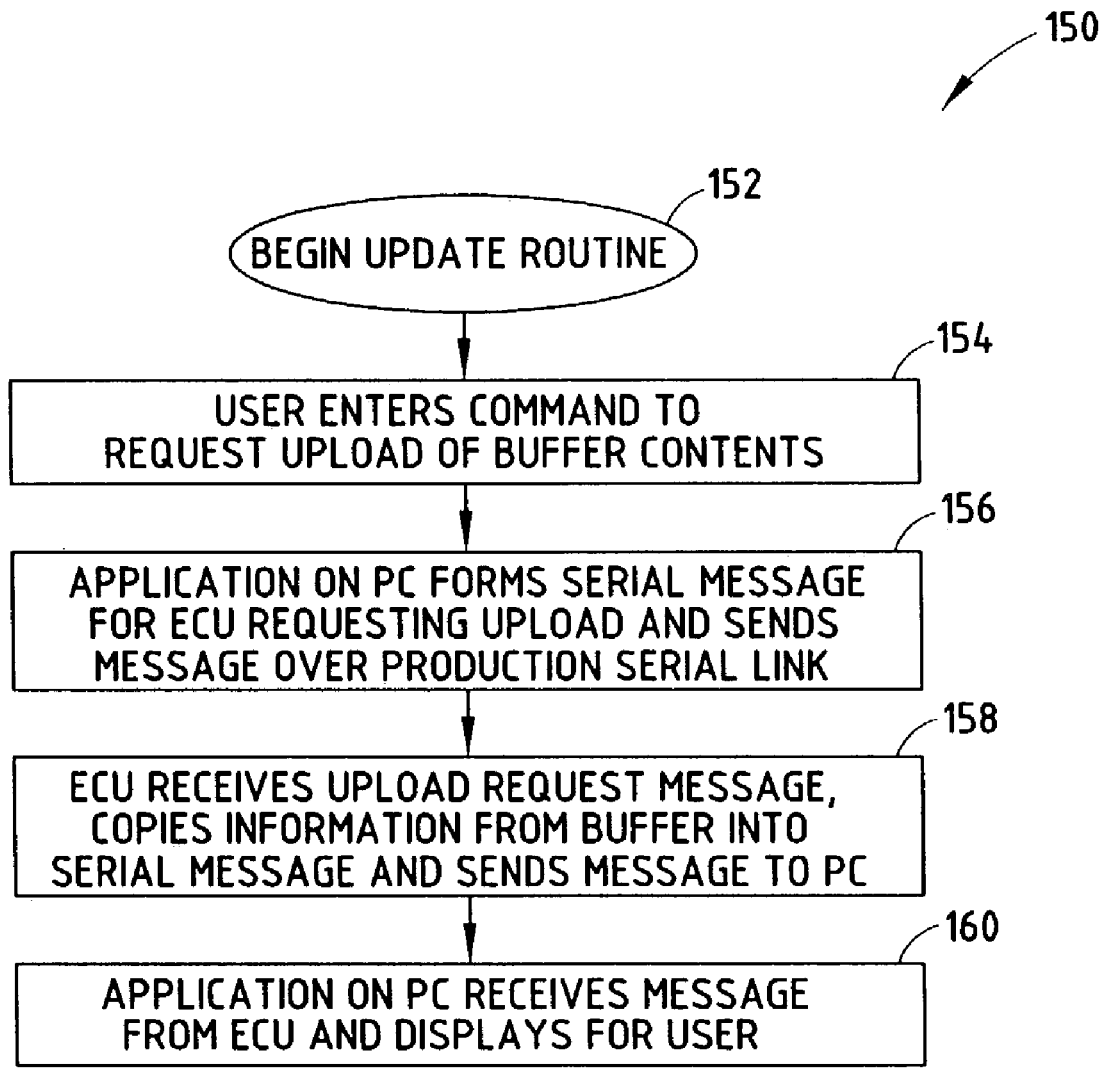
FIG. 5 is a routine for uploading stored variables from the electronic control unit.

Referring to FIG. 5, a routine 150 is illustrated for uploading the stored variables from the electronic control unit upon receiving a read message from a user. Routine 150 begins at step 152 and proceeds to step 154 in which a user enters a read command to request the uploading of the variables stored in the memory buffer. Next, in step 156, an application on the personal computer forms a serial message for the electronic control unit requesting the upload and sends the message over the production serial link to the electronic control unit. In step 158, the electronic control unit receives the upload read message, copies information from the memory buffer into the serial message, and sends the message back to the personal computer. Finally, in step 160, the application on the personal computer receives the message from the electronic control unit and displays the message to the user.

Accordingly, the user is able to upload the stored variables that were saved during a debug interrupt service routine that triggered upon detecting a predetermined trigger event. The collection and retrieval of the stored variables enables the user (e.g., diagnostic technician) to diagnose the electronic control unit. By logging data at the predetermined trigger event, a diagnostic technician can learn where software has been and what conditions occurred to get the software to that point. It should be appreciated that any data or information in the digital core that is memory mapped may be collected using the diagnostic technique described herein. This diagnostic technique is useful in a production environment, and may be useful in a development configuration. This method aids also in software development by allowing the software engineer to view the data associated with the program flow.

It should be appreciated that as electronic control units become even more complex and development schedules become shorter, the present diagnostic technique may enable a technician to respond more quickly to a customer's needs and be able to monitor and/or diagnose production issues in the production configuration with minimal impact to the system that is under test.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What claimed is:

1. A method of diagnosing an electronic control unit comprising a microprocessor adapted to execute a software program comprising one or more variables and connected to a memory by a bus, said memory including an address for storing data or executable code, said method comprising the steps of:
   providing a trigger mechanism connected to the bus for monitoring communications bus between the microprocessor and the memory;
   monitoring said communications for a predetermined event, said predetermined event comprising writing data to or retrieving code from said address;
   following detection of said predetermined event, activating the trigger mechanism to interrupt the control unit to transfer said variables to said memory for storage therein,
   receiving, by said control unit, a read message from a diagnostic tool, and
   following said read message, uploading said variables from said memory to said diagnostic tool.

2. The method as defined in claim 1, wherein the electronic control unit is employed on a vehicle, and the electronic control unit communicates messages on a vehicle bus.

3. The method as defined in claim 1, wherein the memory comprises a memory buffer.

4. The method as defined in claim 3, wherein the memory buffer is a circular buffer.

5. The method as defined in claim 1 further comprising the step of saving in memory a time stamp for the event.

6. The method as defined in claim 1 further comprising the step of storing variables for a plurality of events.

7. The method as defined in claim 1, wherein the method is implemented in a production configuration.

8. The method as defined in claim 1, wherein the method is implemented in a development configuration.

\* \* \* \* \*